US 7,829,917 B1
Nov. 9, 2010

(12) United States Patent
Thomas

(10) Patent No.: US 7,829,917 B1
(45) Date of Patent: Nov. 9, 2010

(54) LAYOUT FOR SELF-ALIGNED EMITTER-BASE PROCESSING

(75) Inventor: Stephen Thomas, Redondo Beach, CA (US)

(73) Assignee: HRL Laboratories, LLC, Malibu, CA (US)

( * ) Notice: Subject to any disclaimer, the term of this patent is extended or adjusted under 35 U.S.C. 154(b) by 375 days.

(21) Appl. No.: 11/818,658

(22) Filed: Jun. 14, 2007

(51) Int. Cl.
H01L 29/737 (2006.01)

(52) U.S. Cl. .............. 257/198; 257/197; 257/E29.033

(58) Field of Classification Search .......... 257/E29.033, 257/197, 198
See application file for complete search history.

(56) References Cited

U.S. PATENT DOCUMENTS

| 5,063,427 A | 11/1991 | Tully et al. |
| 5,206,524 A | 4/1993 | Chen et al. |
| 5,345,097 A | 9/1994 | Nakagawa |
| 5,389,554 A | 2/1995 | Liu et al. |
| 5,468,659 A | 11/1995 | Hafizi et al. |
| 5,614,423 A | 3/1997 | Matsuoka et al. |
| 5,717,228 A | 2/1998 | Matsuoka et al. |
| 6,566,693 B1 * | 5/2003 | Thomas et al. ............. 438/312 |

FOREIGN PATENT DOCUMENTS

| EP | 00562272 A2 | 9/1993 |
| JP | 50136159 | 10/1975 |
| JP | 4096274 | 3/1992 |
| JP | 5048078 | 2/1993 |

OTHER PUBLICATIONS

Yataka Murata, et al., "IC-Oriented Self-Aligned High-Performance AlGaAs/GaAs Ballistic Collection Transistors and Their Applications to High-Speed ICs," IEICE Trans. Electron, Sep. 1993, vol. E76-C, No. 9, pp. 1392-1401.

Hiroshi Masuda, et al., "Novel Self-Aligned Submicron Emitter InP/InGaAs HBT's Using T-Shaped Emitter Electrode," IEEE, May 1995, pp. 643-647.

(Continued)

Primary Examiner—Davienne Monbleau
Assistant Examiner—Matthew Reames
(74) Attorney, Agent, or Firm—Tope-McKay & Assoc.

(57) ABSTRACT

The present invention provides a layout for a self-aligned semiconductor device, comprising an emitter mesa structure having an emitter electrode, and a base region that is comprised of a base electrode, with the base electrode deposited along crystal planes of the emitter mesa structure that undercut when the emitter mesa structure is etched, while avoiding depositing of the base electrode along crystal planes of the emitter mesa structure that do not undercut when the emitter mesa structure is etched. This allows the emitter electrode and the base electrode to self-align along the crystal planes that the emitter mesa structure undercuts when etched, and be isolated along the crystal planes that the emitter mesa structure does not undercut when etched. The present invention further provides dual interconnects mechanism and for connecting external circuitry to various semiconductor layers.

35 Claims, 11 Drawing Sheets

OTHER PUBLICATIONS

Shoji Yamahata, et al., "Over-220-Ghz-f, and fmax InP/InGaAs Double-Heterojunction Bipolar Transistors with a New Hexagonal-Shaped Emitter," IEEE, 1995, pp. 163-166.

Sadao Adachi, et al., "Chemical Etching Characteristics of (001) InP," J. Electrochem. Soc.: Solid-State Science and Technology, vol. 128, No. 6, (Jun. 1981), pp. 1342-1349.

S. Yamahata, et al., "Advanced InP/InGaAs HBT Technology for Low-Power Lightwave Communication Circuit Applications," 2000 GaAs MANTECH Conference, pp. 37-40.

S. Noor Mohammand, et al., "Fundamentals, performance and reliability of III-V compound semiconductor heterojunction bipolar transistors," University of Illinois at Urbana—Champaign Materials Research Laboratory & Coordinated Science Laboratory.

* cited by examiner

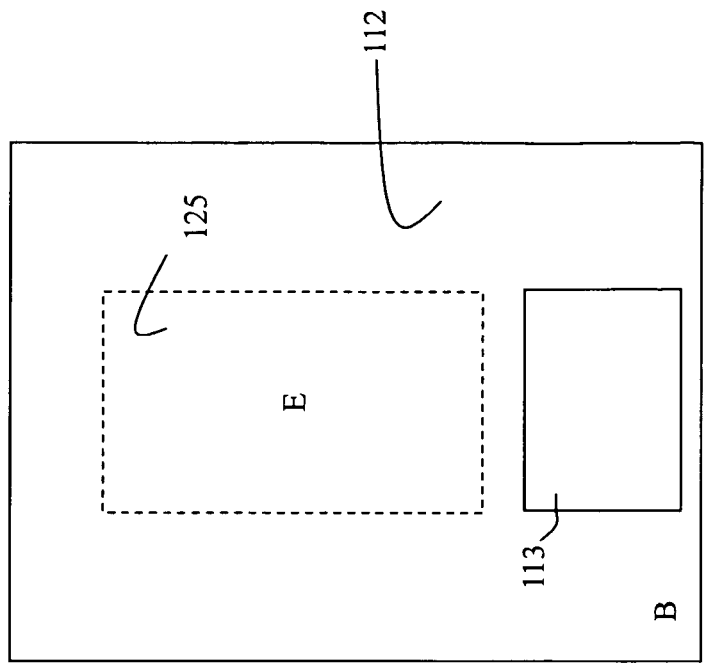
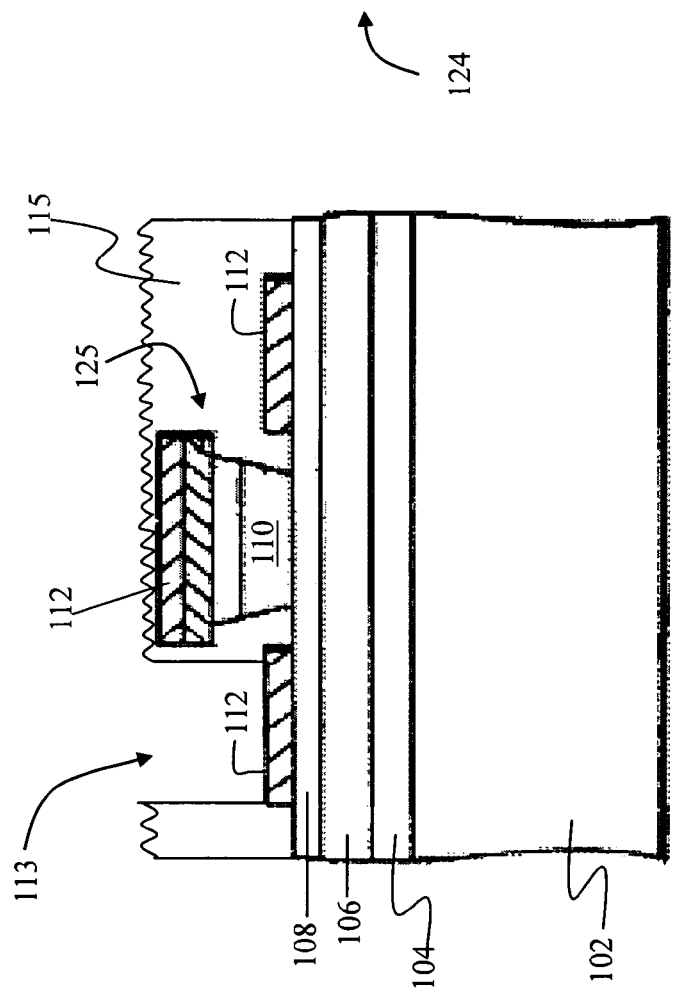
FIG. 1B
(PRIOR ART)
FIG. 1C
(PRIOR ART)

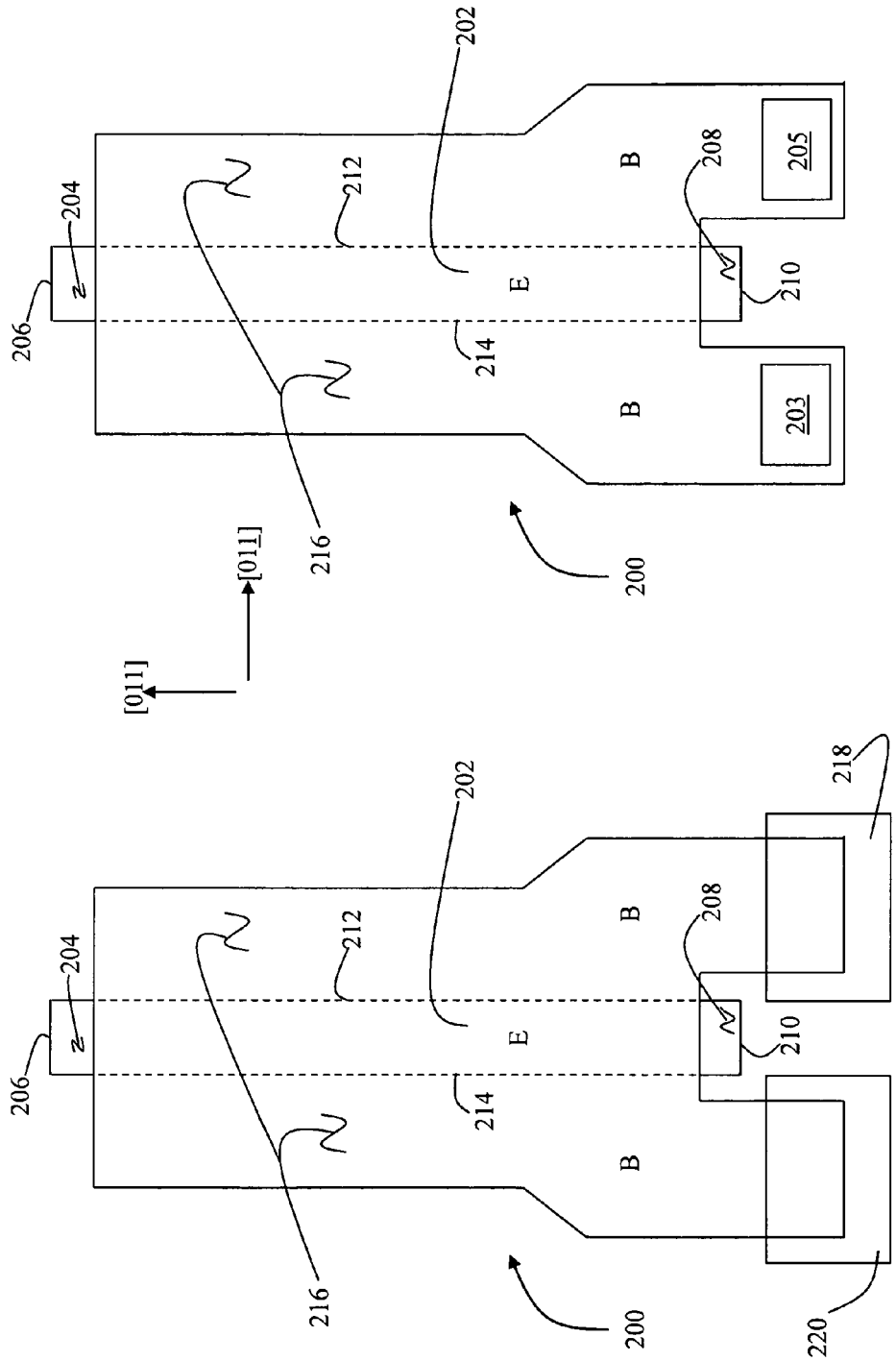

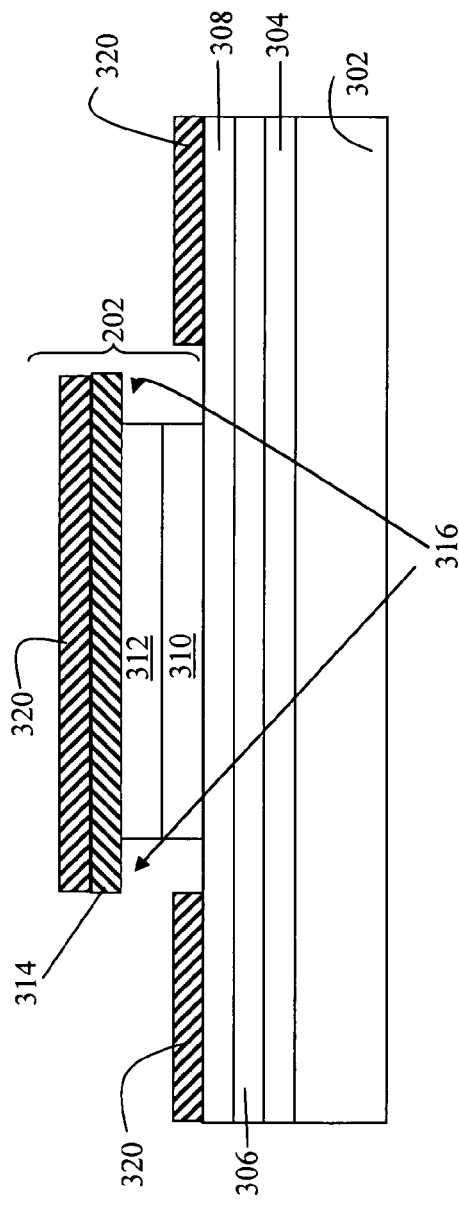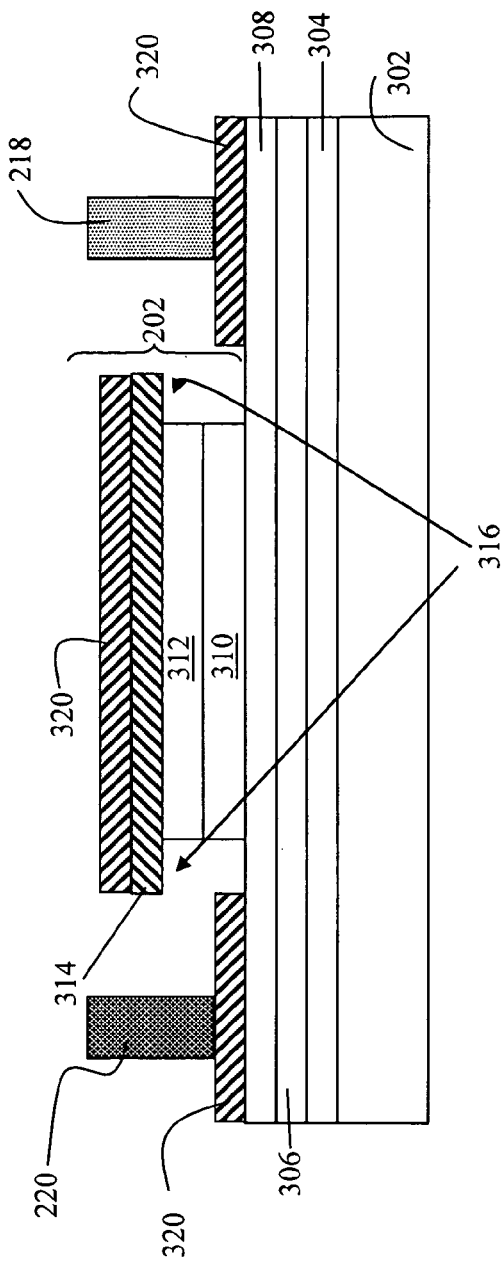
FIG. 3E
FIG. 3F

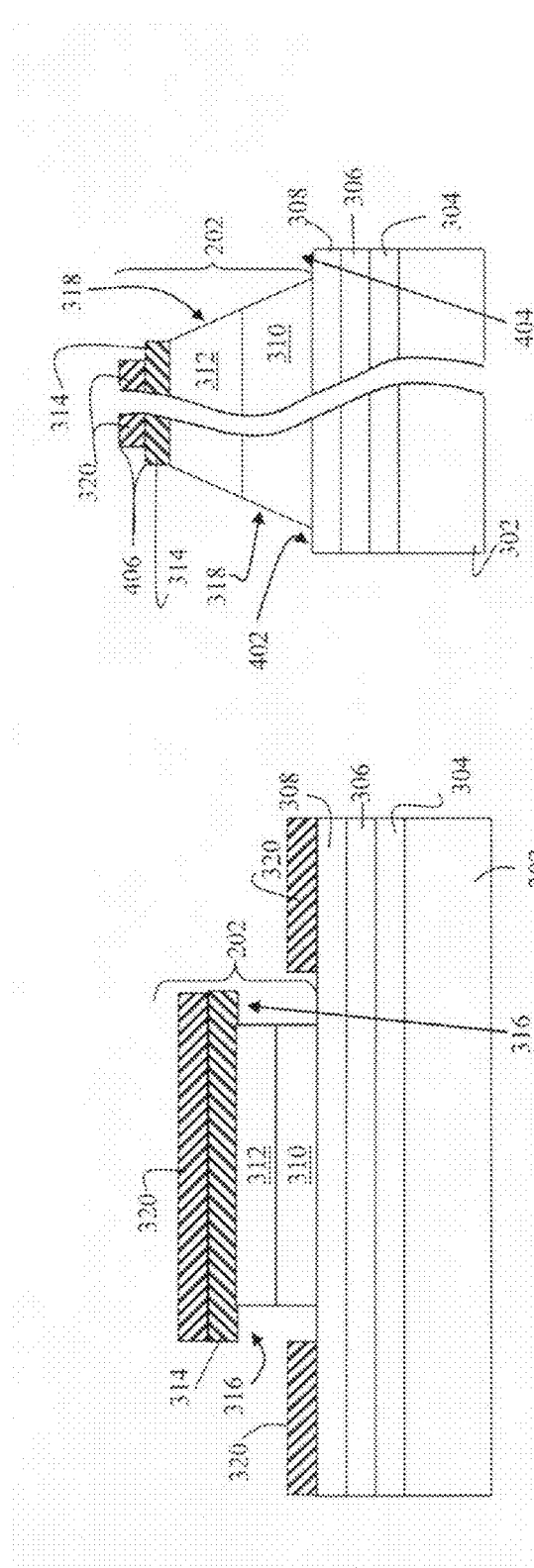
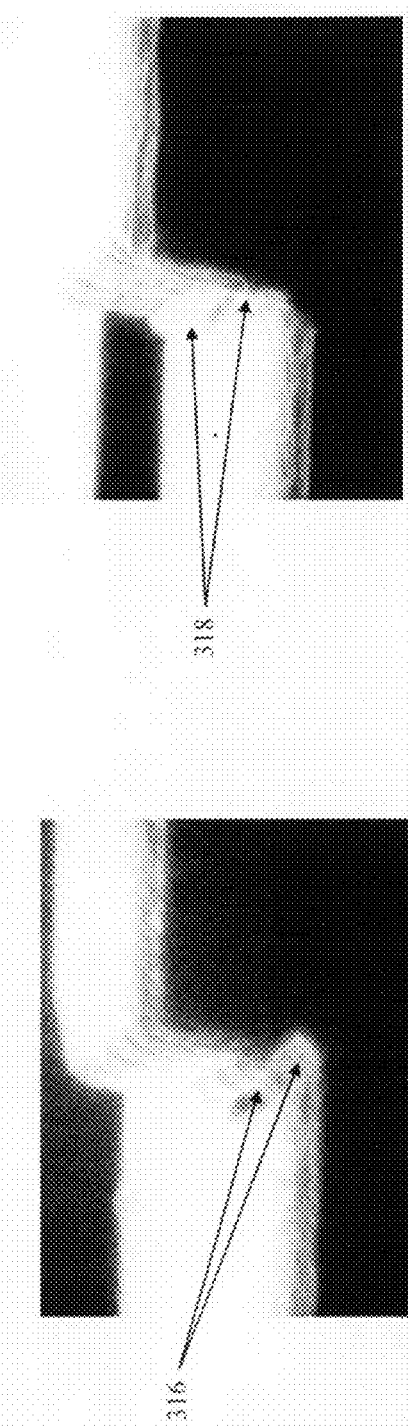
FIG. 4A
FIG. 4B
FIG. 4C
FIG. 4D

LAYOUT FOR SELF-ALIGNED EMITTER-BASE PROCESSING

STATEMENT REGARDING FEDERALLY SPONSORED RESEARCH OR DEVELOPMENT

This invention relates to work performed in contract with the U.S. Government under contract N66001-01-C-8033, and the U.S. Government may have certain rights in this invention.

BACKGROUND OF THE INVENTION (1) Field of the Invention

This invention relates to emitter-base processing, and more particularly, to layout for self-aligned emitter-base processing for any two or more terminal device.

(2) Description of Related Art

Heterojunction bipolar transistors (HBTs) are comprised of a heterostructure formed from two or more semiconductors having different bandgaps and a close lattice match. The structure of HBTs is similar to that of BJTs, with the exception that HBTs use a wider bandgap emitter. As disclosed in a publication by S. Noor Mohammand et al., titled "Fundamentals, performance and reliability of III-V compound semiconductor heterojunction bipolar transistors," University of Illinois at Urbana-Champaign, Materials Research Laboratory & Coordinated Science Laboratory, the frequency performance in HBTs is governed by the vertical structure of the epitaxial layers, the layout design, and the processing methods. The layout design and the processing methods influence parasitics such as the capacitance across the extrinsic base-collector junction, contact resistances in series with the emitter, base, and collector, and inductance caused by interconnects and wires. In general, the largest component of the base-collector capacitance originates in the extrinsic base region used to contact the base layer of the transistor. Therefore, the purpose of any viable HBT processing is to reduce the space between the emitter and the base to lower emitter-base resistance to make the HBT operation faster, reduce the extrinsic base capacitance to allow for higher frequency operation of the HBT device, and finally reduce the contact (or ohmic) resistance. Most, if not all, of the parasitics may in general be assuaged by the use of self-alignment processes.

To obviate the above-mentioned parasitics in an HBT structure, it is critical to align the active emitter area, the emitter contact, and the base contact patterns with one another. In most cases, an aligned emitter contact metal can overlap with the extrinsic base area without causing a short in the emitter-base junction, which allows for a smaller spacing between the emitter and the base. This alignment may be achieved by purposeful design or by mere self-alignment of the base electrode under a "T" type emitter mesa structure, which may be etched using a variety of well-known technologies.

The U.S. Pat. Nos. 5,614,423 and 5,717,228, both to Matsuoka et al., disclose a conventional self-aligned HBT and a conventional method for self-aligned HBT fabrication. The entire disclosures of both U.S. Pat. Nos. 5,614,423 and 5,717,228 are incorporated herein by reference, and are hereinafter collectively referred to as Matsuoka et al. In summary, Matsuoka et al. describes a hexagonal shaped emitter layer that is patterned on the wafer such that all edges of the hexagon are along crystal planes that are suppose to undercut when wet etched.

In particular, as disclosed by Matsuoka et al., compound semiconductor HBTs are generally fabricated by epitaxially growing desired semiconductor layers including an emitter layer, a base layer, and a collector layer on a semiconductor substrate, with the crystal plane (100) taken as a main surface, etching some of the semiconductor layers thus obtained to form a mesa structure, and forming ohmic contacts on the emitter, base, and collector layers. In general, in crystallography, Miller indices enclosed in a parenthesis ( ) indicate a crystal plane, and those enclosed in brackets [ ] indicate direction. In addition, herein, in expressing Miller indices for planes or directions, negative indices are indicated by underlining.

As the prior art shown in FIG. 1A illustrates, the conventional HBT mesa structure may be comprised of a semi-insulate InP substrate 102, which has deposited thereon a $n^+$-doped InGaAs collector contact layer 104, and a $n^-$-doped or undoped InGaAs collector layer 106, and a $p^+$-doped InGaAs base layer 108. The HBT mesa structure in its emitter region has an $n^-$-doped InP emitter layer 110, a $n^+$-doped InGaAs emitter contact layer 114, and an emitter electrode 116. The HBT also includes a base electrode 112 deposited on the base layer 108 and the emitter electrode 116.

The prior art FIG. 1B is the cross-sectional illustration of the same semiconductor device in the (011) plane that is shown in the prior art FIG. 1A, with the added layer of dielectric material 115. As illustrated, in most instances the fabricated semiconductor is generally covered with a deposit of dielectric material 115 to protect the entire device (including the emitter mesa structure 125) against outside elements, to allow for handling of the device, and to provide for a multiple level interconnect scheme, with each level having a specific circuit topography. An opening, a through, or a via 113, is then provided to allow access to the various layers, including the illustrated base metal layer 112 of the device through the dielectric material 115. The top (or plan) view 124 of the prior art emitter mesa structure 125 of FIG. 1B is illustrated in the prior art FIG. 1C. As illustrated, the base metal 112 is deposited such that the emitter mesa structure 125 is completely contained within, and surrounded by the base metal 112, and hence, only a single access mechanism 113 is used to access the base mesa.

Referring back to FIG. 1A, in the conventional HBT, the crystal orientation of the emitter region in the plane (100) is oriented in a direction parallel to the [011] or [01$\underline{1}$] direction. This means that when a semiconductor substrate 102 having a (100) plane in a main surface is used, its orientation flat is selected so as to be in the (011) plane where cleave facets tend to appear, i.e., in the direction parallel to the [01$\underline{1}$] direction. In general, wafers do not have a completely round circumference. Most wafers have two straight or flat sections along their circumference, which are referred to as major flat and a minor flat. In general, lithography equipment uses these non-rounded circumferential distortions as a reference or starting point to orient the wafers at a fixed topography, for eventual patterning. Hence, the orientation flat is used by lithographic equipment as a "compass" to the wafer topography to pattern wafers. Therefore, it is considered natural to set the direction of arranging the emitter so that it is parallel or vertical to the orientation flat or plane (011) of the main surface of the substrate 102. Nonetheless, the control of the crystal orientation of the emitter only in a direction parallel to the [01$\underline{1}$] or [011] directions raises a problem in relation to the anisotropy of the crystal upon wet etching.

Referring to the cross-sectional view in the (011) plane for the conventional HBT indicated by arrow 100, the layers of the HBT are aligned such that an under-cut 118 is formed underneath only two of the peripheral portions or sides of the emitter electrode 116 because of anisotropic wet etching. Wet etching is the process where the material to be etched is dissolved when immersed in a chemical solution. Usually a mask is used for selective etching of the material. A mask is an element that covers (or masks) a material to be etched for selective etching of that material. An anisotropic entity is one where its physical properties vary with direction. Hence, anisotropic etch is one in which the etch rate in the direction normal to the surface is much higher than in direction parallel to the surface. In other words, with anisotropic material, different etch rates take place at different directions within the same material. Therefore, with anisotropic etching, no undercutting takes place in certain directions, which means that the lateral distortion of pattern is minimized. Accordingly, due to the anisotropic nature of the illustrated crystal, an anisotropic wet etching takes place where in the [01$\bar{1}$] direction the emitter electrode 116 and base electrode 112 are not self-aligned (no undercutting), and cause a short (tapered or slanted edge 120) between the base electrode 112 and the emitter electrode 116 in the [01$\bar{1}$] direction. This is illustrated in the cross-section view in the (0$\bar{1}$1) plane of the crystal, pointed to by the arrow 101. This is despite the under-cut 118 along the [011] direction of the emitter mesa structure. Hence, given the anisotropic nature of the crystal, it is not easy to make the base electrode 112 narrower, which would be advantageous in reducing the contact area between the base 108 and collector 106 to reduce parasitic capacitance, or reduce the spacing between the base 112 and the emitter 116 electrodes to reduce the distance for current flow, allowing faster operation of the HBT device.

As shown in the prior art FIG. 1A, the emitter mesa structure in the cross-sectional view of the (011) plane pointed by the arrow 100 is formed by wet etching and is in the form of a trapezoid with its lower edge (layer 110) being shorter than its upper edge (layer 116), which forms the under-cut 118 to form the "T" like mesa structure. This is the cross-sectional view in the (011) plane taken along the direction parallel to the [01$\bar{1}$] direction. On the contrary, as illustrated in the cross-section view in the (0$\bar{1}$1) plane indicated by the arrow 101, along a direction parallel to the [011] direction, the emitter mesa is in the form of a trapezoid with its upper edge (layer 116) being shorter than its lower edge (layer 110), with the trapezoid non-parallel edges forming an outwardly slanted or tapered structure 120.

In anisotropic wet etching (due to the anisotropic nature of the crystal), the wet etching proceeds along a vertical direction so that the base layer 108 is exposed, but the side etching along the [01$\bar{1}$] direction does not proceed substantially, which causes the outwardly slanted structure 120 to form. Under these conditions, the method for fabricating a self-alignment structure by the deposition of a base metal for the formation of the base electrode 112 on the surface of the semiconductor substrate in the region that includes the emitter mesa gives a structure in which the base electrode 112 tends to contact the emitter layer 110 in a cross-section of the outwardly slant form 120. If the base electrode 112 contacts the emitter layer 110 (through the coating of the base metal 112 on the outwardly slant form 120), leakage current that flows between the emitter 110 and base 108 increases, reducing the current gain. In some cases, an emitter-base short occurs between the base electrode 112 and the emitter electrode 116, so that the HBT device cannot operate as a transistor at all.

The prior art FIG. 1D illustrates the solution proposed by Matsuoka et al. to try to overcome the problems associated with the anisotropic wet etching along the [01$\bar{1}$] direction of the crystal. As illustrated, the Matsuoka et al. disclosed a hexagonal shaped emitter layer 116 that is patterned on the wafer such that all edges of the hexagon are along crystal planes that are suppose to undercut when wet etched. In other words, the process should allow for isotropic wet etching due to the isotropic nature of the crystal along the illustrated directions. The region where the emitter electrode is to be provided is defined such that the crystal orientation in the plane (100) in which the emitter is defined is parallel to any of the [001], [010] and [011] directions. In other words, the crystal orientation defining the emitter in the plane (100) is restricted to a direction other than the [01$\bar{1}$] direction so that no over-cut mesa such as the slant 120 illustrated in the prior art FIG. 1A should appear. The top (or plan) view 134 of the prior art emitter mesa structure 135 is illustrated in the prior art FIG. 1E. As illustrated, the base metal 112 is deposited such that the emitter mesa structure 135 is completely contained within, and surrounded by the base metal 112, and hence, only a single access mechanism 113 is used to access the base mesa.

Referring back to the prior art FIG. 1D, the four-edged emitter 116 is transformed into a six edge emitter, with intersecting points 130 and 132 appearing between edges along the [010] and [001] directions on the periphery of an emitter electrode region. The ends of the emitter-base junction 150 and 152 (illustrated in the cross-sectional view in the (0$\bar{1}$1) plane indicated by the arrow 101), underneath the line connecting the intersecting points 130 and 132 seem to have replaced the slanted or tapered edges 120 illustrated in FIG. 1A. As illustrated, the base electrode material 112 is also deposited on the emitter electrode 116 as shown. However, in the cross-section along the (011) plane indicated by arrow 100, an under-cut mesa seems to appear, so that the electric isolation between the emitter and base seems to be perfect.

When viewed in the (0$\bar{1}$1) plane (indicated by arrow 100), the cross section or profile is in the form of an outward slant (not shown), and on the face of it, there could be the danger of an emitter-base short or an increase in leakage current between the emitter and base. However, the emitter electrode 116 does not seem to have any edge that is parallel to the [01$\bar{1}$] direction, but instead its edges seem to be defined in directions parallel to the [010] and [001] directions, as indicated by arrows A and B, respectively. Since etching along the [001] or [010] direction, like the etching along the [011] direction, proceeds symmetrically, the points 150 and 152 where the emitter-base junction seem to be exposed, and seem to move or be retreated toward the inside of the emitter electrode 116. This is because etching from both sides seems to proceed uniform in the intersecting points 130 and 132 between the edges parallel to the [010] and [001] directions on the periphery of the emitter electrode region. Therefore, perfect electrical isolation between the emitter and base seem to be achieved, even in the cross-section as viewed in the (011) or (0$\bar{1}$1) planes.

Matsuoka et al. further disclosed another example, where the layer structure of the crystal and fabrication process for fabricating the HBT is substantially the same, but the crystal orientation of the emitter electrode is defined in the (100) plane by two edges parallel to the [010] direction, and two edges parallel to the [001] direction. In this case, the emitter mesa is surrounded by the (001), (010), (00$\bar{1}$), and (0$\bar{1}$0) planes where etching proceeds vertically and at the same rate so that an under-cut seem to be formed along the entire periphery of the emitter mesa.

The disadvantage of the teachings of Matsuoka et al. is that it is nearly impossible or difficult to pattern a perfectly sharp angle (or corner) to create perfect intersecting points 130 and 132, to avoid the emergence of any unwanted edge along the [01$\bar{1}$] direction. As illustrated in FIG. 1F, which shows the magnified or enlarged intersecting point 130, some rounding of the resist pattern parallel along the [01$\underline{1}$] direction will undoubtedly occur, creating an edge 131 along the [01$\underline{1}$] direction. However, as was described above, due to the anisotropic nature of the crystal, the edge 131 will not undercut in the [01$\underline{1}$] direction, and will remain exposed. This edge 131 will create the same problems that were described and illustrated in relation to FIG. 1A, with respect to the slanted or tapered edges 120. One could surmise that the variation in the self-aligned device of Matsuoka et al. is caused by the variation in the sharpness of the corners 130 and 132.

Accordingly, in light of the current state of the art and the drawbacks to current semiconductor mesa structures and methods of fabrications thereof mentioned above, a need exists for a semiconductor mesa structure and a method of fabrication thereof that would allow for self-aligned emitter-base transistors when the only etches available for the emitter material do not undercut the emitter metal along one of the crystal planes to establish a reliable electric isolation between an emitter and a base.

BRIEF SUMMARY OF THE INVENTION

The present invention provides a method for handling faceted etching when forming self-aligned emitter-base regions of the transistor. The layout of the base metal allows the undercut sides of the emitter to be self-aligned while avoiding the tapered edge that would produce an emitter-base short. The purpose of the invention is to allow self-aligned emitter-base transistors when the only etches available for the emitter material do not undercut the emitter metal along one of the crystal planes. The alternative is a non-self-aligned emitter-base structure that has higher base resistance and higher base area (higher base-collector capacitance) that lead to slower device performance.

One aspect that the present invention provides a layout for a self-aligned semiconductor device. The layout comprises a first semiconductor layer with a second semiconductor layer on the first semiconductor layer, the second semiconductor layer having crystal planes. A first conductive material layer is disposed on the second semiconductor layer. A second conductive material layer is disposed along the crystal planes of the second semiconductor layer that are undercut (i.e., an undercut portion) when the second semiconductor layer is etched, while avoiding depositing of the second conductive material layer along crystal planes of the second semiconductor layer that do not undercut (i.e., a whole portion) when the second semiconductor layer is etched. Additionally, the first conductive material layer and the second conductive material layer are electrically isolated by virtue of being self-aligned along the crystal planes that the second semiconductor layer undercuts when etched (the undercut portion). Finally, the first conductive material layer and the second conductive material layer are electrically isolated along the crystal planes that the second semiconductor layer does not undercut when etched (the whole portion) by virtue of there being no overlap (forming a gap) between the two conductive material layers along those crystal planes.

In another aspect, the first conductive material layer and the second conductive material layer are comprised of different materials.

In yet another aspect, the first conductive material layer and the second conductive material layer are comprised of the same material, but are doped with different amounts of the same dopant.

It can be appreciated that the present invention further includes a dual interconnect mechanism for connecting external circuitry to various semiconductor layers. The dual interconnect mechanism is selected from a group consisting of a post and a via.

In another aspect, the layout for a self-aligned semiconductor device comprises an emitter mesa structure comprised of an emitter electrode. Also included is a base region that is comprised of a base electrode. The base electrode is deposited along crystal planes of the emitter mesa structure that are undercut (i.e., undercut portion) when the emitter mesa structure is etched, while avoiding depositing the base electrode along crystal planes of the emitter mesa structure that do not undercut (i.e., whole portion) when the emitter mesa structure is etched. The emitter electrode and the base electrode are self-aligned along the crystal planes that the emitter mesa structure undercuts when etched, and isolated along the crystal planes that the emitter mesa structure does not undercut when etched (whole portion). Also included is a dual interconnect mechanism attached with the electrodes for connecting external circuitry to various semiconductor layers. As above, the dual interconnect mechanism is selected from the group consisting of a post and a via. Additionally, the self-aligned semiconductor is comprised of at least two layers of semiconductor material of a different type to form a two terminal self-aligned device.

In another aspect, the emitter mesa structure further comprises an emitter layer deposited on a base layer, an emitter contact layer deposited on the emitter layer, and the emitter electrode deposited on the emitter contact layer.

The emitter layer is comprised of InP and the emitter contact layer is comprised of InGaAs. The emitter layer has a lower concentration of n-type impurity compared with the emitter contact layer, which has a higher concentration of n-type impurity. The n-type impurity is one of Si and Se.

In yet another aspect, the emitter electrode is comprised of Ti, Pt, and Au layers.

In another aspect, the emitter layer is comprised of InAsP and the emitter contact layer is comprised of one of InAs and InAsP.

In yet another aspect, the base region is further comprised of a base layer, with the base electrode deposited on the base layer. The base layer is comprised of InGaAs with a p-type impurity. In this case, the p-type impurity is one of C, Be, and Zn.

In another aspect, the base layer is comprised of a graded InAs to InAsP with a p-type impurity.

In yet another aspect, the layout for a self-aligned semiconductor device comprises a substrate with a collector region on the substrate. The substrate is comprised of a semi-insulated InP. A base region is on the collector region, with an emitter mesa structure on the base region. The emitter mesa structure is comprised of an emitter electrode, and the base region is comprised of a base electrode. The base electrode is deposited along crystal planes of the emitter mesa structure that undercut when the emitter mesa structure is etched, while avoiding depositing of the base electrode along crystal planes of the emitter mesa structure that do not undercut when the emitter mesa structure is etched. Similar to the configuration above, the emitter electrode and the base electrode are self-aligned along the crystal planes that the emitter mesa structure undercuts when etched, and isolated along the crystal planes that the emitter mesa structure does not undercut when etched.

In another aspect, the collector region is comprised of an $n^+$ InGaAs collector contact layer and an $n^-$ InGaAs collector layer. Additionally, the base region is further comprised of $p^+$ InGaAs base layer.

In another aspect, the emitter mesa structure is further comprised of an n⁻ InP emitter layer, an n⁺ InGaAs emitter contact layer, and the emitter electrode, which is comprised of Ti, Pt, and Au layers. Additionally, the collector region is comprised of one of a n⁺ InAs and InAsP collector contact layer and one of a n⁻ InAs and InAsP collector layer. The base region is further comprised of p⁺ graded InAs to InAsP base layer.

In another aspect, the emitter mesa structure is further comprised of a n⁻ InAsP emitter layer, one of a n⁺ InAs and InAsP emitter contact layer, and the emitter electrode, which is comprised of Ti, Pt, and Au layers.

The present invention also comprises a heterojunction bipolar transistor (HBT). The HBT comprises an emitter, a base, and a collector. The base and collector together form a base-collector mesa. The HBT also comprises a sub-collector mesa, an emitter metal contact, two self-aligned base metal contacts, two base posts, a collector metal contact, and one of a collector post and a collector via. The base is positioned between the emitter and the collector such that the base-collector mesa is sandwiched between the emitter and the sub-collector mesa.

The HBT is fabricated by a method comprising the acts of patterning the emitter metal contact; depositing the emitter metal contact on the emitter, incompletely covering the emitter; etching the emitter not covered by the emitter metal contact to expose the base; patterning the two self-aligned base metal contacts; and depositing the two self-aligned base metal contact on the base with the base metal deposited along crystal planes of the emitter that undercut when the emitter is etched, while avoiding depositing of the base metal along crystal planes of the emitter that do not undercut when the emitter is etched. The emitter metal and the base metal are self-aligned along the crystal planes that the emitter undercuts when etched, and isolated along the crystal planes that the emitter does not undercut when etched.

The method also comprises acts of patterning the two base posts; depositing the two base posts on the two self-aligned base metal contacts; patterning the base collector mesa on the base not covered by the two self-aligning base metal contacts; etching the base not covered by the two self-aligned base metal contacts to fabricate the base-collector mesa and define and incompletely expose the sub-collector mesa; patterning the collector metal contact; depositing the collector metal contact on the sub-collector mesa exposed by fabricating the base collector mesa; patterning the collector post or via, and depositing the collector post on the collector metal contact or etching a collector via through a subsequent insulating film to the collector metal contact.

In the fabricating act, a "III-V" substrate was used to grow the emitter, the collector, and the base. Also in the fabricating act, an Indium Phosphide (InP) substrate is used to generate the emitter, the collector, and the base. Finally, the HBT is incorporated into an integrated circuit.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

FIG. 1B is an exemplary prior art cross-sectional illustration of the semiconductor device in the (011) plane shown in the prior art FIG. 1A, with the added layer of dielectric material;

FIG. 1C is an exemplary prior art illustration that shows the top (or plan) view of the structure of the conventional HBT illustrated in FIG. 1A;

FIG. 2A is an exemplary illustration of the top (or plan) view of an emitter mesa structure using posts for the interconnect, in accordance with the present invention;

FIG. 2B is an exemplary illustration of the top (or plan) view of an emitter mesa structure using via for the interconnect, in accordance with the present invention;

FIGS. 3A to 3C, and 3E to 3G are exemplary illustrations that show the cross-section of the semiconductor device structure along the (011) plane during various stages of a fabrication process in accordance with the present invention.

FIG. 4A is an exemplary illustration of the semiconductor device in cross-section along the (011) plane in accordance with the present invention;

FIG. 4B is an exemplary illustration of the semiconductor device in cross-section along the (0$\underline{1}$1) plane in accordance with the present invention;

FIG. 4C illustrates an exemplary InAsP emitter layer etching along the plane parallel to the major flat; and FIG. 4D illustrates an exemplary InAsP emitter layer etching along the plane perpendicular to the major flat.

Figure 1A:
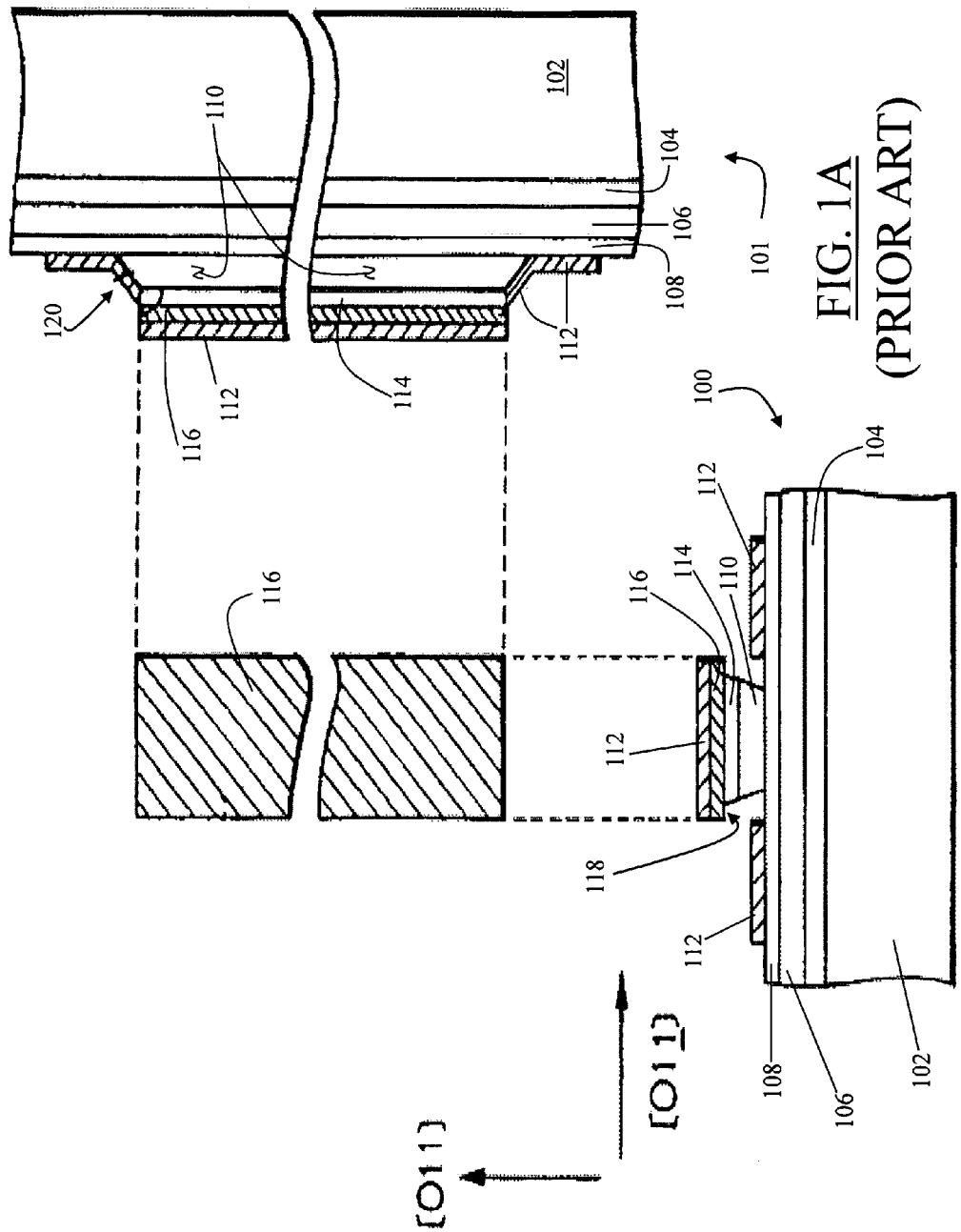
FIG. 1A is an exemplary prior art illustration that shows part of the structure of a conventional HBT, including its emitter and base in cross-section and in plan views.
Figure 1D:
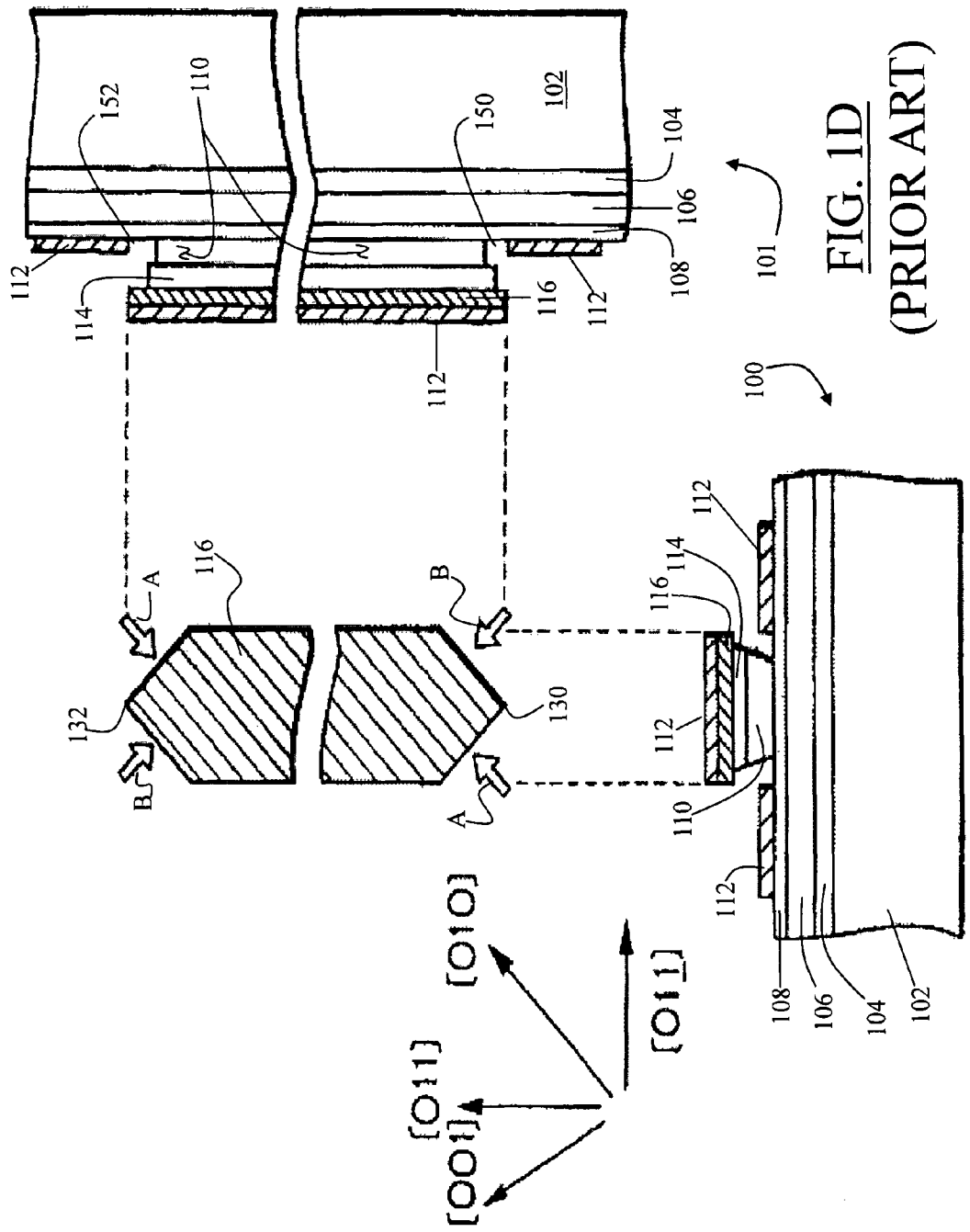
FIG. 1D is an exemplary prior art illustration that shows part of the structure of a conventional HBT, including its emitter and base in cross-section and in plan views.

DETAILED DESCRIPTION OF THE INVENTION (1) Introduction

Fabrication of self-aligned devices using standard wet etches and liftoff technology is impractical due to anisotropic nature of some of the semiconductor materials used in semiconductor mesa structures. Self-alignment requires undercut etching of a top layer of the mesa structure along all four sides, but for anisotropic semiconductors two of the four sides of the structure do not perfectly undercut when using standard wet etch and liftoff technology. In fact, for some semiconductor materials such as InP and InAsP, suitable etch material do not exist to provide for undercut etching along all four sides of an emitter mesa structure.

The present invention provides a method for fabrication of a self-aligned device using the same standard wet etch and liftoff technology when at least one side of the device does not provide for undercut etching of the top layer. The present invention provides a novel method for handling faceted etching when forming self-aligned emitter-base regions of the transistor. The present invention provides a novel layout that allows the undercut sides of the emitter mesa to be self-aligned while avoiding the tapered edges that would produce an emitter-base short. In addition, the present invention also makes use of a dual base metal interconnect, where the traditional layouts only use a one-sided or single interconnect to the base.

Accordingly, the present invention allows for the fabrication of self-aligned emitter-base transistors when the only etches available for the emitter material do not undercut the emitter metal along one of the crystal planes. Before providing details regarding the various methodologies of the invention, first a glossary of terms is provided as a reference for the reader. Next, a system overview is provided, describing the interconnection and operation of various major components of a system in accordance with the present invention. Finally, after the system overview, a detailed explicatory section is provided in which the various major components presented in the system overview are described in detail.

(2) Glossary

This section presents an exemplary glossary of some of the terms used in the description and claims. The glossary is intended to provide the reader with a general understanding of various terms as they are used in this disclosure, and is not intended to limit the scope of these terms. Rather, the scope of the terms is intended to be construed with reference to this disclosure as a whole and with respect to the claims below. Further, the definitions provided should not be considered limiting to the extent that the terms are known in the art. These definitions are provided to assist in the understanding of the present invention.

Anisotropic etch—Anisotropic etch is one in which the etch rate in the direction normal to the surface is much higher than in direction parallel to the surface; no undercutting (i.e. lateral distortion of pattern is minimized). In other words, different etch rates occur at different directions.

Bandgap—Bandgap is the energy difference between the highest valence band and the lowest conduction band.

Bipolar devices—Bipolar devices are those that rely on minority carrier transport and, as such, their critical dimension is a vertical one which is determined by deposition as opposed to lithography.

Bipolar transistors—Bipolar transistors are those that use the injection of minority carriers across a forward-biased junction. That is, they operate by injection and collection of minority carriers. More specifically, the basic operation of a bipolar transistor involves minority carrier injections in the forward-biased emitter-base junction, minority carrier transfer through the base, and the collection of minority carriers in the reverse-biased collector junction. Since both electrons and holes are important in this device, it is called a bipolar transistor.

Diffusion—Diffusion is a passive form of random movement of electrons and or holes from an area of higher concentration to an area of lower concentration. Diffusion is one of a series of steps in the fabrication of a semiconductor. This step introduces a small amount of a chemical element, called on impurity or dopant, into the substrate. These steps will produce either N-type or P-type regions to create the function of a desired component on the chip.

Doping (p-doped/n-doped)—Doping is the deliberate introduction of an element(s) (also known as an impurity) that alters the conductivity of a semiconductor. For example, adding boron to silicon will create a P-type (more positive) material, while adding phosphorus or arsenic to silicon will create N-type (more negative) material.

Drift—Drift is the gradual departure from an intended course (such as electrons and or holes in a junction) due to external influences (such as an applied voltage.)

Dry etching—Dry etching is a process where the material to be etched is sputtered or dissolved using reactive ions or a vapor phase etchant.

Epitaxial growth—The technique of growing an oriented single-crystal layer on a substrate is called epitaxial growth, the non-limiting examples of which include liquid-phase epitaxy, Vapor-Phase Epitaxy, Molecular Beam Epitaxy, etc.

Epitaxial transistor—Epitaxial transistors are that made from a semiconductor material by the latter's deposition on a suitable monocrystalline support.

Epitaxy—Epitaxy is the unified crystal growth or deposition of one crystal layer on another. Process by which thin layer of single-crystal material is deposited on single-crystal substrate; epitaxial growth occurs in such way that the crystallographic structure of the substrate is reproduced in the growing material; also crystalline defects of the substrate are reproduced in the growing material.

Etching—Etching is the process of eroding, cutting, reducing, dissolving or removing of material.

Heterojunction—A heterojunction is a heterostructure formed because of an abrupt change in chemical composition during the epitaxial growth process of two or more semiconductors.

Heterostructure—A heterostructure is formed from two or more semiconductors having different bandgaps and a close lattice match.

Junction—Junction are defined in semiconductor materials and devices region in which two materials featuring distinctly different electrical properties are in contact; e.g., p-n junction and metal-semiconductor junction (contact).

Interconnect—An interconnect or interconnect metal is a mechanism that allows connection of the various layers of a mesa semiconductor device with the external circuits.

Isotropic—Isotropic is referred to a medium, the physical properties of which do not vary with direction.

Isotropic etch—Isotropic etch is one in which the rate of etching reaction is the same in any direction. In other words, the same etch rate in all directions.

Lattice—The periodic arrangement of atoms in a crystal is called a lattice.

Lithography—Lithography is a printing process where image areas and non-image areas are separated chemically.

Mask—An element that covers (or masks) a material to be etched for selective etching that material is called a mask.

Mesa structures—Mesa structure is a flat-topped or plateau structure.

Miller indices—Miller indices are numbers that define a set of parallel planes in a lattice. A combination of three digits, either 1 or 0, e.g., (100), (111), etc., used to define orientation of the crystallographic planes in a crystal. In other words, a set of coordinates defining specific crystallographic plane in the crystal.

MOCVD—MOCVD stands for Metal-Organic Chemical Vapor Deposition; A CVD process which uses metal-organic compounds as source materials; metal-organics thermally decompose at temperatures lower than other metal containing compounds; method often used in epitaxial growth of very thin films of III-V semiconductors.

Molecular Beam Epitaxy (MBE)—MBE is a physical deposition process (evaporation) carried out in ultra-high vacuum (below $10^{-8}$ torr) and at substrate temperature typically not exceeding 800° C. Due to unobstructed (molecular) flow of species to be deposited and chemical cleanliness of the substrate surface, highly controlled growth of ultra-thin epitaxial layers is possible using MBE. MBE is the highest precision deposition method used in semiconductor processing.

Ohmic contact—The ohmic contact allows electrical current flow into or out of the semiconductor. Low resistance is desired between the contact and the semiconductor. Metal-semiconductor contact with very low resistance independent of applied voltage (may be represented by constant resistance); to form an "ohmic" contact metal and semiconductor must be selected such that there is no potential barrier formed at the interface (or potential barrier is so thin that charge carriers can readily tunnel through it).

Orientation Flat—Orientation flat refers to the two straight or flat sections along the circumference of a wafer. Lithography equipment uses these non-rounded circumferential distortions as a reference or a starting point to orient the wafers at a fixed topography, for eventual patterning. Hence, the orientation flat is used by lithographic equipment as a "compass" to the wafer topography to pattern wafers.

Parasitic Capacitance—The parasitic capacitance stores unwanted energy.

Parasitic Resistance—The parasitic resistance dissipates energy through ohmic loss.

Photoresist—Photoresist is an organic polymer that becomes soluble when exposed to ultraviolet light. It contains a light-sensitive substance whose properties allow image transfer onto a Printed Ciruit Board (PCB). It is used in many applications within various industries such as semiconductor, biomedical engineering, holographic, electronics, and nano-fabrication. As an example, photoresist is used to help define circuit patterns during chip fabrication in the semiconductor industry. Using photoresist prevents etching or plating of the area it covers (this is also known as resist).

Superlattice—Superlattice is a semiconductor structure comprising of several ultra-thin layers (atomic layers) engineered to obtain specific electronic and photonic properties; slight modifications of chemical composition of each layer result in slight variations of energy bandgap from layer to layer: bandgap engineering; fabrication of superlattices requires high-precision heteroepitaxial deposition methods such as MBE and MOCVD; typically involves III-V semiconductors.

Wet etching—Wet etching is the process where the material to be etched is dissolved when immersed in a chemical solution.

(3) System Overview

Figure 1E:
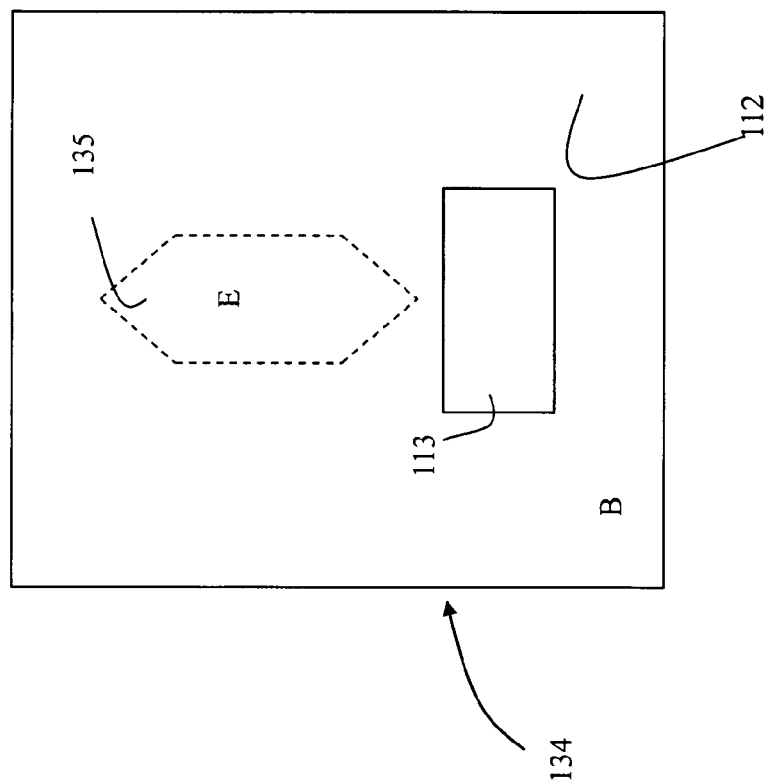
FIG. 1E is an exemplary prior art illustration that shows the top (or plan) view of the structure of the other conventional HBT illustrated in FIG. 1D.
Figure 1F:
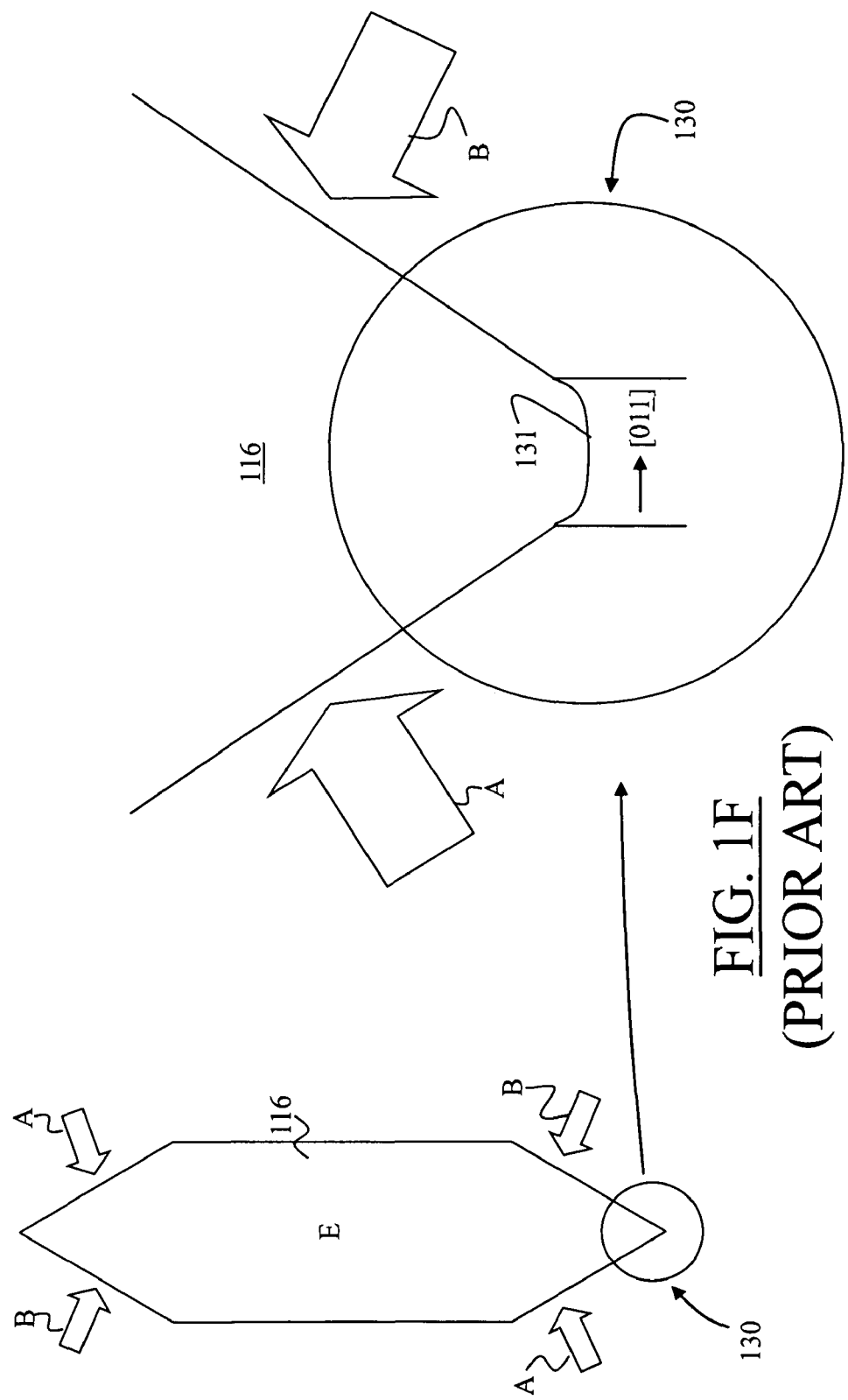
FIG. 1F is an exemplary prior art illustration that shows an enlarged, top view of the emitter illustrated in FIG. 1D, showing the rounding of the resist pattern parallel along the [01$\underline{1}$] direction.

As the top view 200 of the emitter mesa structure 202 of the present invention in FIGS. 2A and 2B illustrate, one of the main features of the present invention is that unlike the prior art where the base metal is deposited such that the emitter metal is completely contained within, and surrounded by the base metal (illustrated in the prior art FIGS. 1C and 1E), the present invention deposits and patterns the base metal 216 only along the [011] direction of the emitter 202, which partially includes the two longer sides 212 and 214 of the emitter 202, where the use of standard etching technology undercuts the emitter metal, providing clear separation between the emitter 202 and subsequent depositing of the base metal 216. The present invention does not deposit any base metal 216 along the [01$\underline{1}$] direction of the emitter 202, which includes the two shorter sides 206 and 210 of the emitter 202, where the use of standard etching technology does not undercut the emitter metal (forming a whole portion). In fact, the present invention does not deposit base metal on the emitter surface areas 204 and 208, that are proximal to the respective emitter edges 206 and 210. Unlike the prior art, with the present invention, the base metal is therefore not continuous, and is physically separated into two halves partially along the longer edges 212 and 214 of the emitter mesa, as illustrated.

As further illustrated in both FIGS. 2A and 2B, the present invention also makes use of a dual base metal interconnect, where the traditional layouts only use a one-sided or single interconnect to the base. An interconnect or interconnect metal is a mechanism that allows access for connection of the various layers of a mesa semiconductor device with external circuits. As illustrated in FIG. 2A, the present invention provides posts 220 and 218 for an interconnect in a manner disclosed in the U.S. Pat. No. 6,566,693 to Thomas, III et al., titled "Reduced Capacitance Scaled HBT Using a Separate Base Post Layer," the entire disclosure of which is incorporated herein by reference. The post 220 provides an interconnect for the base metal 216 (on the left side of the emitter 202 along the edge 214 as illustrated in the figure), and the post 218 provides an interconnect for the base metal 216 on the right side. As an alternative embodiment illustrated in FIG. 2B, the present invention may also be practiced using openings (or vias) 203 and 205 to provide interconnect for the base metal 216 on both sides of the emitter 202.

Regardless of the specific type of interconnect being used, with the present invention, a dual interconnect mechanism is required for connecting external circuit topographies to various layers of the semiconductor device mesa structure. As illustrated, the base metal is deposited such that the emitter mesa structure 202 is not completely contained within, and is not completely surrounded by the base metal and, hence, the base metal 216 on one side of the emitter 202 is isolated from the base metal 216 on the other side. Therefore, two access or interconnect mechanisms are used to access the base mesa on each side of the emitter mesa 202. Accordingly, all the benefits of the self-aligned semiconductor devices are maintained, in addition to complete isolation between the base and the emitter along the [01$\underline{1}$] direction. It should be obvious to those skilled in the art that if only one interconnect is used, then the base metal on the side of the emitter that does not have an interconnect will do nothing because that base metal is isolated from the base metal on the other side of the emitter mesa. Therefore, any current through the base metal that does have an interconnect would double the base resistance, which would effect the operation and efficiency of the semiconductor.

(4) Explicatory Section

In general, the structural features of the semiconductor mesa structure of the present invention are similar to those of conventional semiconductors, and can be fabricated in a manner similar to the method in which the conventional semiconductors are fabricated. However, in the present invention, base metal 216 is not deposited over the areas 204 and 208, which are proximal to the respective edges 206 and 210 that are in the [01$\bar{1}$] direction of the emitter 202.

Figure 3A:
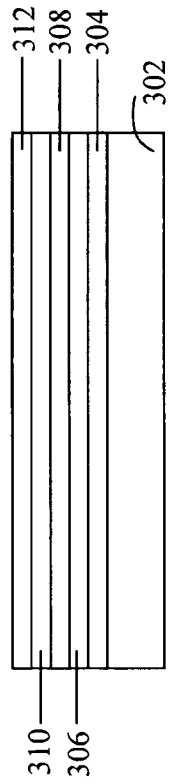

In particular, FIGS. 3A to 3G illustrate the layer structure of a crystal, which may be formed by well-known processes of molecular beam epitaxy (MBE) or metal-organic chemical vapor deposition (MOCVD). All layers are epitaxially grown in sequence as illustrated. As the cross-sectional view along the (011) plane in FIG. 3A illustrates, the HBT mesa structure may be comprised of a semi-insulate InP substrate 302, which has deposited thereon a collector contact layer 304. The layer 304 may be comprised of a $n^+$-InGaAs containing a high concentration of an n-type impurity or dopant for forming an ohmic contact, which is grown on the InP substrate 302. A collector layer 306 is then grown on the collector contact layer 304. The layer 306 is comprised of an $n^-$-type (low concentration) impurity or dopant or an undoped InGaAs. The base layer 308 is then deposited on the collector layer 306. The base layer 308 is comprised of a $p^+$-InGaAs, containing a high concentration of a p-type impurity, the non-limiting examples of which may include C, Be, Zn, etc. The emitter region (emitter mesa structure 202) of the HBT mesa structure has an $n^-$-InP emitter layer 310 grown on the base layer 308. The emitter layer 310 contains low concentration of n-type impurity, the non-limiting examples of which may include Si, Se, etc. An emitter contact layer 312 is then grown on the emitter layer 310. The emitter contact layer 312 is comprised of $n^+$-InGaAs, which includes a high concentration of an n-type impurity the non-limiting examples of which may include Si, Se, etc. The emitter contact layer 312 deposited on the emitter layer 310 may be used for establishing an ohmic contact to the emitter.

Other HBT structures, for example, an InAs-based HBT may also be used. For the InAs-based HBT, typically an InP buffer layer is grown on an InP substrate followed by a collector contact layer. The collector contact layer may be comprised of a $n^+$-InAs or InAsP containing a high concentration of an n-type impurity or dopant for forming an ohmic contact, which is grown on the InP buffer layer. A collector layer is then grown on the collector contact layer, the collector layer is comprised of an $n^-$-type (low concentration) impurity or dopant or an undoped InAs or InAsP. The base layer is then deposited on the collector layer. The base layer is comprised of a $p^+$-InAs or InAsP or a grade thereof, containing a high concentration of a p-type impurity, the non-limiting examples of which may include C, Be, Zn, etc. A graded layer is one where there is a gradual transition from InAs to InAsP within the layer. In this case, the emitter region (emitter mesa structure) of the HBT mesa structure can have an $n^-$-InAsP emitter layer grown on the base layer. The emitter layer may contain low concentration of n-type impurity, the non-limiting examples of which may include Si, Se, etc. An emitter contact (or cap) layer is then grown on the emitter layer. The emitter contact layer may be comprised of $n^+$-InAs or InAsP, which includes a high concentration of a n-type impurity, non-limiting examples of which may include Si, Se, etc. The emitter contact layer deposited on the emitter layer may be used for establishing an ohmic contact to the emitter.

Figure 3B:
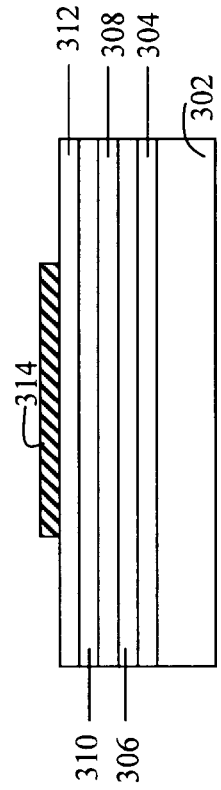
Figure 3C:
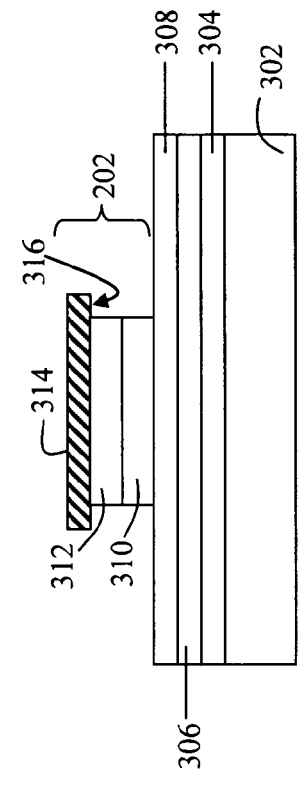
Figure 3D:
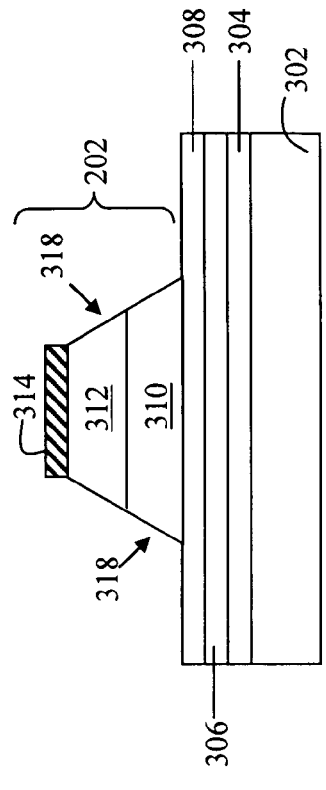
FIG. 3D is the exemplary illustration that shows the cross-section of the semiconductor of FIG. 3C along the (0$\underline{1}$1) plane in accordance with the present invention.

Regardless of the HBT structure being used (InP or InAs), next, an emitter electrode 314, which includes a laminate of Ti, Pt, and then Au layers or a layer of WSi is formed by liftoff (FIG. 3B). Then, the InGaAs emitter contact layer 312 and a part of the InP emitter layer 310 are etched using the emitter electrode 314 as an etching mask by reactive ion etching (RIE) with chlorine gas or chlorine-containing gas utilizing electron cyclotron resonance. In this dry etching, etching proceeds vertically but no side etching occurs. Subsequent to the dry etching, wet etching is performed, for example, with a mixture of sulfuric acid, hydrogen peroxide, and water to effect side etching of the InGaAs emitter contact layer 312 below the emitter electrode 314. In this step, there occurs no etching of the InP emitter layer 310. Thereafter, the InP emitter layer 310 is etched with a mixed solution that is composed of hydrochloric acid and water to expose the InGaAs base layer 308. In this wet etching, the InGaAs emitter contact layer 312 and the InGaAs base layer 308 are not etched. The wet etching does not last for a long time but it is only necessary for it to continue until the base layer 308 is exposed. Thus, the structure shown in the (011) plane, and illustrated in FIG. 3C, is obtained. The same structure is shown in FIG. 3D in the (0$\bar{1}$1) plane with the tapered or slanted edges 318. Alternatively, the InP emitter layer 310 may have a small thickness as far as it can be depleted completely. Accordingly, the time of the selective etching of the emitter layer 310 with a mixture of hydrochloric acid and water does not have to last for a longer time than is necessary.

As the cross-sectional view in the (011) plane in FIG. 3E illustrates, a base electrode material 320 is then deposited on the emitter electrode 314, but only in the region that includes the two longer sides of the emitter mesa in the [011] direction (the longer sides 212 and 214 illustrated in the top or plan view 200 in FIGS. 2A and 2B), with no deposition of electrodes on the surface areas 204 and 208, near the proximal edges 206 and 210 parallel to the [01$\bar{1}$] direction (the shorter sides of the emitter 202 illustrated in FIGS. 2A and 2B). Finally, after the base metal 320 has been deposited, the two base posts 218 and 220 are patterned and lifted off, as illustrated in FIG. 3F, and as disclosed in U.S. Pat. No. 6,566,693 to Thomas, III et al., which provide access points to the device.

Figure 3G:
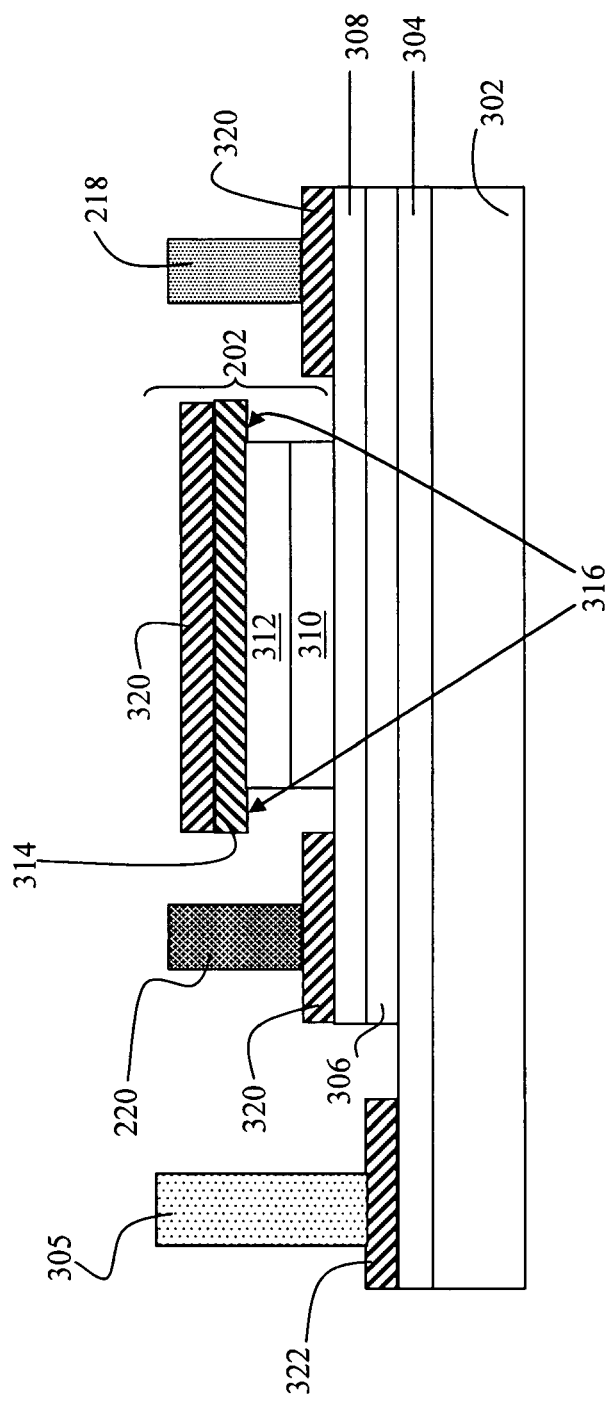

The base and emitter are protected against etching using photoresist, and the field area, which is the area outside the semiconductor mesa structure, is etched generating a base-collector mesa. The sub-collector is then protected against etching with photoresist, and the final semiconductor device mesa structure is isolated from other device mesa structure by etching the field areas. Note that semiconductor devices are fabricated on a wafer, and hence, need to be separated (or isolated) from each other. Collector metal 322 is then deposited on the sub-collector to contact the collector as illustrated in FIG. 3G, which shows the crystal structure in the (011) plane. The device then is covered with a dielectric material for the reasons mentioned above, and planarized. Planarization is a well known process that "flattens" the mesa semiconductor device to form a uniform surface for further processing, which includes etching the planarizing agent to expose the emitter and the posts, and a via or a post 305 is then patterned and etched to the collector metal 322. An interconnect metal may then be deposited to connect the device to other circuits or pads for testing.

Figure 3H:
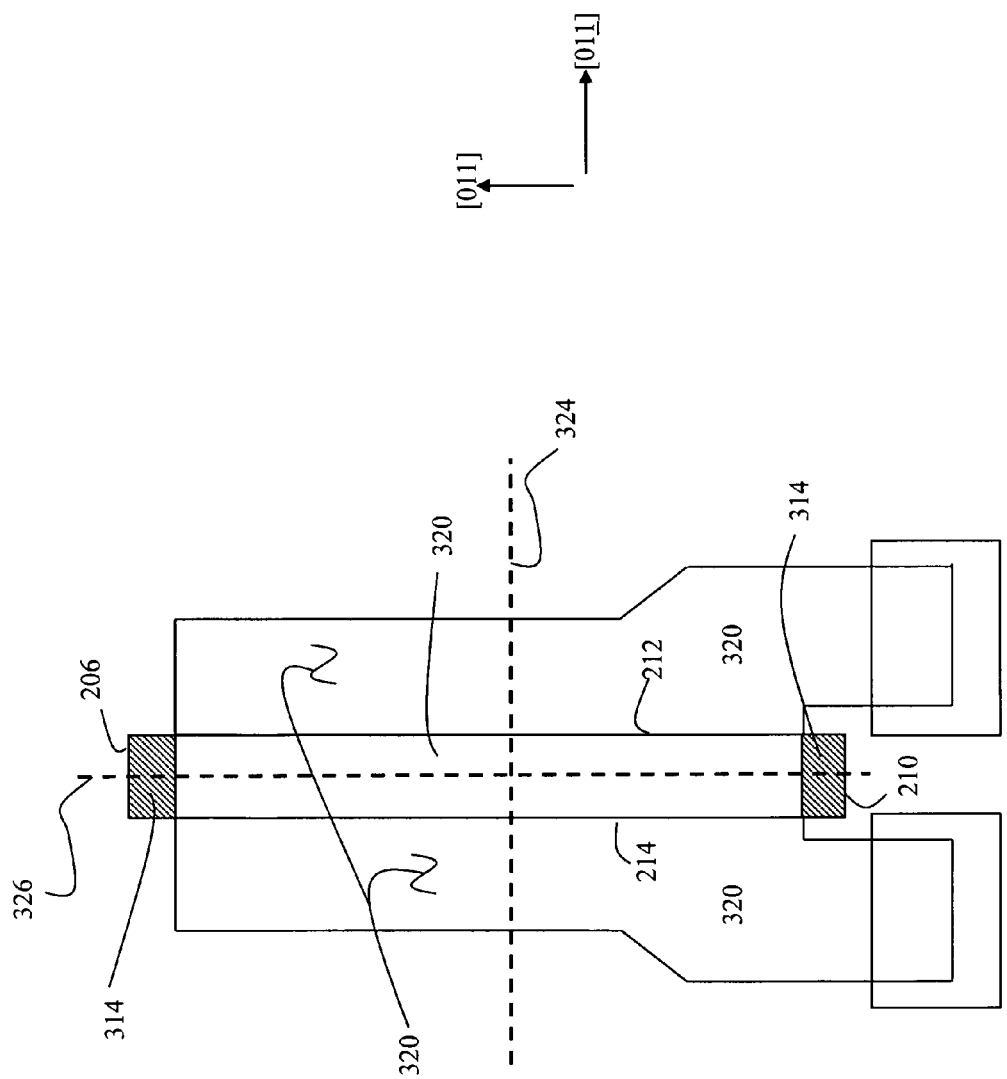
FIG. 3H is an exemplary illustration of the top (or plan) view of an emitter mesa structure of a semiconductor device in accordance with the present invention, where a visualization horizontal axis 324 shows the positioning of a cross-sectional cut used to generate the cross-sectional view illustrated in FIG. 4A, and where a visualization vertical axis 326 shows the positioning of a profile cut used to generate the profile view illustrated in FIG. 4B.

As previously stated, in the present invention, the base metal or base electrode material 320 is deposited on the emitter electrode 314, but only in the region that includes the two longer sides of the emitter mesa in the [011] direction (the longer sides 212 and 214 illustrated in the top (or plan) view in FIG. 3H), with no deposition of base electrode material 320 on the surface areas near the proximal edges 206 and 210 parallel to the [011] direction. In order to visualize the various semiconductor layers present in the invention, two distinct visual cuts are made along the semiconductor's cross sections. The first visual cut is made along the visualization horizontal axis 324 in FIG. 3H, which illustrates the positioning of a cross-sectional cut to be made in order to generate the cross-sectional view illustrated in FIG. 4A. The second visual cut is made along the visualization vertical axis 326 in FIG. 3H, which illustrates the positioning of a profile cut used to generate the profile view illustrated in FIG. 4B.

As illustrated in FIG. 4A, in a cross-section along the (011) plane, an under-cut mesa 316 appears, so that the electric isolation between the emitter and base is perfect. On the other hand, when viewed in the (0$\underline{1}$1) plane (FIG. 4B), the cross-section or profile is in the form of an outward slant 318, and on the face of it, there could be the danger of an emitter-base short or an increase in leakage current between the emitter and base. However, in the present invention, the emitter electrode 314 has no base metal 320 deposited on the edges of the emitter that are parallel to the [01$\underline{1}$] direction, as viewed in the (0$\underline{1}$1) plane.

Since no base metal 320 is deposited along shorter sides of the emitter electrode 314, the points 402 and 404 where the emitter-base junction is exposed remain exposed. At the same time, a gap 406, or absence of conductive material, is present between the base metal 320 and the emitter electrode 314 along the shorter sides of the emitter electrode 314, where the portions of the emitter electrode remain whole or remain not undercut. This gap 406 or absence of conductive material electrically isolates the emitter electrode 314 from the base metal 320 by virtue of lack of conductive material between the base and emitter metals, thus preventing shorting out the base-emitter junction of the transistor. Therefore, perfect electrical isolation between the emitter and base can be achieved even in the cross-section as viewed in the (0$\underline{1}$1) plane. This prevents base metal 320 from shorting to the emitter. The base is self-aligned to the emitter on two longer sides of the emitter, representing the majority of the emitter perimeter. This will lead to a minimum in base resistance and a higher frequency performance for the transistor. FIG. 4C shows how an InAsP emitter layer etches along the planes parallel to the major flat, and FIG. 4D shows the same, but with etches along the planes perpendicular to the major flat. By avoiding deposition of metal 320 over the tapered edge 318 of the device, emitter base shorts are therefore avoided.

Although the invention has been described in language specific to structural features and or methodological operations (or acts), it is to be understood that the invention defined in the appended claims is not necessarily limited to the specific features or operations described. Rather, the specific features and operations are disclosed as exemplary forms for implementing the claimed invention. Accordingly, while exemplary illustrative embodiments of the invention have been described, numerous variations and alternative embodiments will occur to those skilled in the art. For example, the present invention has been described using an InP-based HBT, but other HBT structures that may include those of the "III-V" type, the non-limiting examples of which include those grown on InP substrates, for example InP/InGaAs or AlInAs/InGaAs/InP, and those grown on GaAs substrates, for example, GaAs/AlGaAs or GaAs/InGaP, may also be used.

In addition, in the above description, the explanation has been presented based on the most basic structure in InP/InGaAs systems regarding the layer structure of the crystal; however, the present invention should not be construed as being limited thereto. The present invention is also applicable to double heterojunction bipolar transistors and HBTs made of other material systems such as AlGaAs/GaAs and the like. In fact, although the description is directed to the fabrication of a heterojunction bipolar transistor (HBT), it should be understood that the present invention can be applied to any two or three terminal device that benefits from self-aligned processing, non-limiting examples of which may include diodes, bipolar transistors (both homojunction and heterojunction varieties), field effect transistors, etc. In addition, the present invention may be applied to any crystal that does not undercut along one crystal plane, and should not be merely limited to the semiconductor materials, such as those of "III-V" types that have been disclosed. As for the fabrication process, the description has been presented based on the process in which the emitter electrode is formed first and wet etching is performed using the emitter electrode as a mask. However, the present invention should not be construed as being limited to this type of fabrication process but can also be applied to various fabrication processes as far as they use emitter mesa etching which may or may not involve wet etching or etching with an etching solution in a part or all of the process. In the present invention, emitter and base electrodes are formed separately so that both electrodes may be made of different electrode materials, i.e., various electrode materials with different compositions can be used in combination. More particularly, p- and n-type electrode materials can be used for the base and emitter electrodes, respectively, and, hence, electrodes having excellent ohmic characteristics can be obtained. In addition, the base and emitter electrodes can be made of the same conductive material doped with a dopant at different concentrations. This enables simplification of the fabrication process. Those skilled in the art will recognize that HBTs according to the present invention can be incorporated into integrated circuits for use in a broad range of applications, particularly communications-based applications. Such variations and alternate embodiments are contemplated, and can be made without departing from the spirit and scope of the invention.

What is claimed is:

1. A layout for a self-aligned semiconductor device, comprising:
   a first semiconductor layer;
   a second semiconductor layer on the first semiconductor layer, the second semiconductor layer having crystal planes, where a portions of the second semiconductor layer are whole, which is not undercut, and where other portions of the second semiconductor layer are undercut;
   a first conductive material layer on the second semiconductor layer opposite the first semiconductor layer; and
   a second conductive material layer formed along the portions of the second semiconductor layer that are undercut, the second conductive material layer also being formed such that a gap, which is an absence of conductive material, exists between the two conductive material layers at the whole portions of the second semiconductor layer; and
   where the first conductive material layer and the second conductive material layer are electrically isolated from each other by virtue of the first conductive material layer being aligned to the second conductive material layer along edges of the portions of the second semiconductor layer that are undercut, and also the first conductive material layer and the second conductive material layer being electrically isolated by virtue of the absence of conductive material between the two conductive material layers along the whole portions of the second semiconductor layer.

2. The layout for a self-aligned semiconductor device as set forth in claim 1, wherein the first conductive material layer and the second conductive material layer are comprised of different materials.

3. The layout for a self-aligned semiconductor device as set forth in claim 1, wherein the first conductive material layer and the second conductive material layer are comprised of the same material, but are doped with different amounts of a same dopant.

4. The layout for a self-aligned semiconductor device as set forth in claim 3, further including a dual interconnect mechanism attached with the conductive material layers for connecting external circuitry to various semiconductor layers.

5. The layout for a self-aligned semiconductor device as set forth in claim 4, where the dual interconnect mechanism is selected from a group consisting of a post and a via.

6. A layout for a self-aligned semiconductor device, comprising:
    an emitter mesa structure comprised of an emitter electrode, the emitter mesa structure having crystal planes, where a portions of the emitter mesa structure are whole, which is not undercut, and a where other portions of the emitter mesa structure are undercut;
    a base region that is comprised of a base electrode, with the base electrode being formed along the portions of the emitter mesa structure that are undercut;
    where the emitter electrode is aligned to the base electrode along the portions of the emitter mesa structure that are undercut, and being isolated along the portions of the emitter mesa structure that are whole.

7. The layout for a self-aligned semiconductor device as set forth in claim 6, further including a dual interconnect mechanism connected with the electrodes for connecting external circuitry to various semiconductor layers.

8. The layout for a self-aligned semiconductor device as set forth in claim 7, where the dual interconnect mechanism is selected from the group consisting of a post and a via.

9. The layout for a self-aligned semiconductor device as set forth in claim 8, wherein the self-aligned semiconductor is comprised of at least two layers of semiconductor material of a different type to form a two terminal self-aligned device.

10. The layout for a self-aligned semiconductor device as set forth in claim 9, wherein the emitter mesa structure is further comprised of
    an emitter layer deposited on a base layer,
    an emitter contact layer deposited on the emitter layer, and
    the emitter electrode deposited on the emitter contact layer.

11. The layout for a self-aligned semiconductor device as set forth in claim 10, wherein the emitter layer is comprised of InP and has an n-type impurity concentration, and the emitter contact layer is comprised of InGaAs and also has an n-type impurity concentration, where the emitter layer has a lower concentration of n-type impurity compared with the emitter contact layer with a higher concentration of n-type impurity.

12. The layout for a self-aligned semiconductor device as set forth in claim 11, wherein the n-type impurity is selected from a group consisting of Si and Se.

13. The layout for a self-aligned semiconductor device as set forth in claim 12, wherein the emitter electrode is comprised of Ti, Pt, and Au layers.

14. The layout for a self-aligned semiconductor device as set forth in claim 10, wherein the emitter layer is comprised of InAsP and has an n-type impurity concentration and the emitter contact layer is comprised of one of InAs and InAsP and also has an n-type impurity concentration, where the emitter layer has lower concentration of n-type impurity compared with the emitter contact layer with a higher concentration of n-type impurity.

15. The layout for a self-aligned semiconductor device as set forth in claim 14, wherein the n-type impurity is one of Si and Se.

16. The layout for a self-aligned semiconductor device as set forth in claim 15, wherein the emitter electrode is comprised of Ti, Pt, and Au layers.

17. The layout for a self-aligned semiconductor device as set forth in claim 16, wherein the base region is further comprised of the base layer, with the base electrode deposited on the base layer.

18. The layout for a self-aligned semiconductor device as set forth in claim 17, wherein the base layer is comprised of InGaAs with a p-type impurity.

19. The layout for a self-aligned semiconductor device as set forth in claim 18, wherein the p-type impurity is one of C, Be, and Zn.

20. The layout for a self-aligned semiconductor device as set forth in claim 17, wherein the base layer is comprised of a graded InAs to InAsP with a p-type impurity.

21. The layout for a self-aligned semiconductor device as set forth in claim 20, wherein the p-type impurity is one of C, Be, and Zn.

22. A layout for a self-aligned semiconductor device, comprising:
    a substrate;
    a collector region on the substrate;
    a base region on the collector region; and
    an emitter mesa structure on the base region, the emitter mesa structure having crystal planes, where portions of the emitter mesa structure are whole, which is not undercut, and a where other portions of the emitter mesa structure are undercut;
    where the emitter mesa structure is comprised of an emitter electrode, and the base region is comprised of a base electrode, with the base electrode formed along the undercut portion of the emitter mesa structure;
    where the emitter electrode is aligned to the base electrode along the undercut portion of the emitter mesa structure, and isolated along the whole portion of the emitter mesa structure.

23. The layout for a self-aligned semiconductor device as set forth in claim 22, further including dual interconnects mechanism connected with the electrodes for connecting external circuitry to various semiconductor layers.

24. The layout for a self-aligned semiconductor device as set forth in claim 23, where the dual interconnect mechanism is selected from the group consisting of a post and a via.

25. The layout for a self-aligned semiconductor device as set forth in claim 24, wherein the substrate is comprised of a semi-insulated InP.

26. The layout for a self-aligned semiconductor device as set forth in claim 25, wherein the collector region is comprised of a $n^+$ InGaAs collector contact layer and a $n^-$ InGaAs collector layer.

27. The layout for a self-aligned semiconductor device as set forth in claim 26, wherein the base region is further comprised of $p^+$ InGaAs base layer.

28. The layout for a self-aligned semiconductor device as set forth in claim 27, wherein the emitter mesa structure is further comprised of a $n^-$ InP emitter layer, a $n^+$ InGaAs emitter contact layer, and the emitter electrode, which is comprised of Ti, Pt, and Au layers.

29. The layout for a self-aligned semiconductor device as set forth in claim 25, wherein the collector region is comprised of one of a n⁺ InAs and InAsP collector contact layer and one of a n⁻ InAs and InAsP collector layer.

30. The layout for a self-aligned semiconductor device as set forth in claim 29, wherein the base region is further comprised of p⁺ graded InAs to InAsP base layer.

31. The layout for a self-aligned semiconductor device as set forth in claim 30, wherein the emitter mesa structure is further comprised of a n⁻ InAsP emitter layer, one of a n⁺ InAs and InAsP emitter contact layer, and the emitter electrode, which is comprised of Ti, Pt, and Au layers.

32. A heterojunction bipolar transistor (HBT), comprising an emitter having crystal planes, a base and a collector, wherein the base and collector together form a base-collector mesa, and further comprising a sub-collector mesa, an emitter metal contact, two self-aligned base metal contacts, two base posts, a collector metal contact, and one of a collector post and a collector via, wherein the base is positioned between the emitter and the collector and, accordingly, the base-collector mesa is sandwiched between the emitter and the sub-collector mesa, and the HBT is fabricated by a method comprising the acts of:

patterning the emitter metal contact;
  depositing the emitter metal contact on the emitter, incompletely covering the emitter;
  etching the emitter not covered by the emitter metal contact to expose the base, such that a portion of the crystal planes of the emitter are undercut while a portion of the crystal planes of the emitter remain whole, which is not undercut;
  patterning the two self-aligned base metal contacts;
  depositing the two self-aligned base metal contacts on the base with the base metal being deposited along crystal planes of the emitter that are undercut when the emitter is etched, while avoiding depositing of the base metal on the whole portion of the crystal planes; and
  where the emitter metal and the base metal are self-aligned along the crystal planes that the emitter undercuts when etched, and isolated along the whole portion of the crystal planes of the emitter;
  patterning the two base posts;
  depositing the two base posts on the two self-aligned base metal contacts;
  patterning the base collector mesa on the base not covered by the two self-aligning base metal contacts;
  etching the base not covered by the two self-aligned base metal contacts to fabricate the base-collector mesa and defined and incompletely expose the sub-collector mesa;
  patterning the collector metal contact;
  depositing the collector metal contact on the sub-collector mesa exposed by fabricating the base collector mesa;
  patterning the collector post or via, and
  depositing the collector post on the collector metal contact or etching a collector via through a subsequent insulating film to the collector metal contact.

33. The HBT as set forth in claim 32, wherein in the fabricating act, a "III-V" substrate was used to grow the emitter, the collector, and the base.

34. The HBT as set forth in claim 33, wherein in the fabricating act, an Indium Phosphide (InP) substrate is used to generate the emitter, the collector, and the base.

35. The HBT as set forth in claim 34, wherein in the fabricating act the HBT is incorporated into an integrated circuit.

* * * * *